United States Patent
Tsilioukas

(10) Patent No.: US 7,352,261 B2
(45) Date of Patent: Apr. 1, 2008

(54) PRODUCTION METHOD FOR CHIP-FORM FILM-FORMING COMPONENT

(75) Inventor: Efthimios Tsilioukas, Grefrath (DE)

(73) Assignee: NXP B.V., Eindhoven (NL)

( * ) Notice: Subject to any disclaimer, the term of this patent is extended or adjusted under 35 U.S.C. 154(b) by 272 days.

(21) Appl. No.: 10/549,350

(22) PCT Filed: Mar. 11, 2004

(86) PCT No.: PCT/IB2004/050237

§ 371 (c)(1),
(2), (4) Date: Sep. 14, 2005

(87) PCT Pub. No.: WO2004/084406

PCT Pub. Date: Sep. 30, 2004

(65) Prior Publication Data

US 2006/0192640 A1     Aug. 31, 2006

(30) Foreign Application Priority Data

Mar. 19, 2003   (EP)   ................................. 03100697

(51) Int. Cl.
*H03H 7/01* (2006.01)
*H01P 1/203* (2006.01)

(52) U.S. Cl. ...................................... 333/174; 333/205

(58) Field of Classification Search ................ 333/174, 333/175, 185, 204, 205, 219
See application file for complete search history.

(56) References Cited

U.S. PATENT DOCUMENTS

| | | | | |
|---|---|---|---|---|
| 4,992,759 | A * | 2/1991 | Giraudeau et al. | 333/204 |
| 6,011,452 | A * | 1/2000 | Loukkola | 333/235 |
| 6,072,999 | A |  6/2000 | Konishi et al. | |
| 6,215,374 | B1 * | 4/2001 | Petrovic | 333/177 |
| 6,597,265 | B2 * | 7/2003 | Liang et al. | 333/204 |
| 6,608,538 | B2 * | 8/2003 | Wang | 333/204 |

* cited by examiner

*Primary Examiner*—Seungsook Ham

(57) ABSTRACT

A description is given of a high frequency filter comprising microstrips. The filter comprises at least two resonators (16, 18) which each have, as frequency-determining elements, a first straight microstrip section (28) and a second straight microstrip section (30), which are parallel next to each other, and also a capacitor assembly (22). In each resonator the capacitor assembly is connected between first ends of the microstrip sections and each resonator is exclusively connected to ground at the second ends of the microstrip sections. In each resonator (16, 18) the sum of the two microstrip sections acts as inductive lement. The resonators (16, 18) therefore act in the same manner as a resonator having a single microstrip, the length of which corresponds essentially to the sum of the lengths of the first microstrip section (28) and the second microstrip section (30). This construction of a filter allows a shorter design compared to conventional filter structures.

10 Claims, 4 Drawing Sheets

PRODUCTION METHOD FOR CHIP-FORM FILM-FORMING COMPONENT

The invention relates to a high frequency microstrip filter.

In the high frequency range, the use of microstrips in the construction of filters is known. Microstrips are strip-like flat conductors which are attached to an insulating substrate. By suitably selecting the corresponding parameters (dimensions, dielectric constant of the substrate material, etc.) it is possible for microstrips to have a desired impedance response at the frequencies in question. To construct filter structures, it is known to build resonators consisting of microstrips and capacitors. Microstrips which run parallel to and at a distance from one another are electromagnetically coupled. By suitably selecting the values and dimensions of the components and also their arrangement in relation to one another, a desired filter characteristic can be set.

Such filters are used, for example, in HF transmitters or receivers. In this case, bandpass filters, for example, are necessary in order to permit frequency selection. This may be achieved by filters having an adjustable mean frequency. Adjustable filters may also be constructed with the aid of variable capacitors, for example in the form of capacitance diodes (varactors).

U.S. Pat. No. 6,072,999 discloses a receiver comprising a variable filter. The filter is constructed with microstrips. Resonators are formed in each case of a microstrip and a capacitor assembly, wherein the capacitor assembly consists of a series circuit of a fixed capacitor and a capacitance diode. A first resonator is connected to an input and a second resonator is connected to an output The microstrips of the first and second resonators run in parallel at a distance from one another and are electromagnetically coupled. The filter exhibits a bandpass characteristic, wherein the mean frequency is variable within a range of about 1-3 GHz. Besides the basic filter structure comprising two resonators, further examples comprising additional, electromagnetically coupled microstrips between the resonators are also given.

US-A-2002/0093400 likewise discloses variable HF filters comprising microstrips. The filters have a number of resonators, formed in each case of a microstrip and a capacitor, wherein the microstrips run in parallel next to one another and at a distance apart and are electromagnetically coupled. An input and an output are coupled to the resonators by direct connection to outer microstrips or by electromagnetic coupling.

When designing electrical circuits, it is always an objective to reduce costs. A simple design of the circuit with as few components as possible is therefore desirable. Another aim is to keep the size of electrical and electronic components as small as possible. Since in the case of microstrips the dimensions are critical for the electrical response, strict limits are in this case placed on filters. The length of the microstrips cannot be reduced without changing the electrical response.

It is therefore an object of the invention to propose a high frequency filter comprising microstrips, which has a small size at least in one dimension.

This object is achieved by a filter as claimed in claim 1. Dependent claims relate to advantageous embodiments of the invention.

The filter according to the invention has at least two resonators, of which one resonator is coupled to the input and one resonator is coupled to the output In one preferred embodiment, the filter only comprises these two resonators. However, it is also possible for the filter to have further resonators.

At least both resonators, preferably all resonators, comprise, as frequency-determining elements, in each case two straight microstrip sections and a capacitor assembly. When considering the frequency-determining elements, only those which affect the filter characteristic in the desired frequency range of the filter are considered. As discussed in more detail below, the resonators may have, for example, variable capacitors which may be connected to a variable voltage in order to vary the filter. Such a connection and the components used for this do not, however, significantly affect the dynamic response in the operating frequency range of the filter and are therefore not regarded as frequency-determining elements of the resonators.

The main concept of the invention is to reduce the overall length of a resonator by dividing the microstrip of the resonator into two microstrip sections. These microstrip sections run in parallel next to one another. The first and second microstrip sections are preferably the same length. In this case, an actual resonator is not formed by each microstrip section but rather a first and a second microstrip section together with the capacitor assembly form a resonator. It is particularly preferred for the resulting filter to have a filter order that corresponds to half the number of microstrip sections. This distinguishes the filter from known filter structures in which each microstrip always forms part of an actual resonator and the result is thus filters of a higher order. The first ends of the microstrip sections are connected to one another via the capacitor assembly, while the second, opposite ends are connected to ground. In the longitudinal direction, the resonator thus formed is considerably smaller than the resonators of known filter structures.

In order to produce a desired filter characteristic, the resonators of the filter are electromagnetically coupled to one another. For this purpose, in each case one microstrip section runs parallel next to a microstrip section of another resonator. The filter characteristic can be suitably adjusted via the degree of coupling. Preferably, the resonators are coupled exclusively electromagnetically, that is to say that—up to the common ground connection—the frequency-determining elements are not directly connected.

The capacitor assembly may comprise one or more components. The capacitance of the capacitor assembly may be fixed or variable. In one preferred embodiment, the capacitor assembly comprises a series circuit of a fixed capacitor and a variable capacitor, for example a capacitance diode. A capacitance diode within the capacitor assembly is preferably connected to a variable voltage via a high impedance resistor, wherein the capacitance can be adjusted via the variable voltage. It is preferred for the capacitor assembly to have a further capacitor besides the capacitance diode, wherein both are connected to in each case one microstrip section. It is then possible to adjust the capacitance of the capacitance diode via a DC bias voltage.

The coupling of the input to a first resonator may be effected by direct connection of the input to a microstrip section of the first resonator. Preferably, a T-shaped structure is then formed from the microstrip section and a coupling microstrip, which intersects the microstrip section. It is not necessary for the point of intersection to lie in the center; rather, the position can be suitably selected in order to adapt the impedance of the coupling. As an alternative to the direct connection of the input to the first resonator, an electromagnetic coupling may also be selected, in which a structure composed of a first coupling microstrip and a second coupling microstrip that runs at right angles thereto is formed. Preferably, the first and second coupling microstrips are arranged in an L-shape. The second coupling microstrip runs in parallel next to a microstrip section of the first resonator and is electromagnetically coupled to the latter.

The coupling possibilities mentioned above in respect of the input also apply in respect of the output. Depending on the application, different (symmetrical—asymmetrical) inputs/outputs may be connected to the filter. The filter itself is preferably designed to be symmetrical.

In one preferred embodiment, the filter is constructed on an insulating substrate, wherein the microstrip sections run on the front side and a conductive layer that is connected to ground is present on the rear side. In each case, the second ends of the microstrip sections of the resonators preferably have a through-connection to the rear side of the substrate.

The invention will be further described with reference to examples of embodiments shown in the drawings to which, however, the invention is not restricted.

In general, the invention relates to filters in the high frequency range, that is to say to frequencies above 500 MHz.

The filters shown in the examples of embodiment are provided for the frequency range of 1.8 to 2.3 GHz. In an HF transmitter for digital video data (DVB-RCS), a QPSK-modulated signal is to be generated in which the undesirable sideband is to be attenuated by at least 60 dBc. The filter used is to be variable in a range of 500 MHz.

Figure 1:
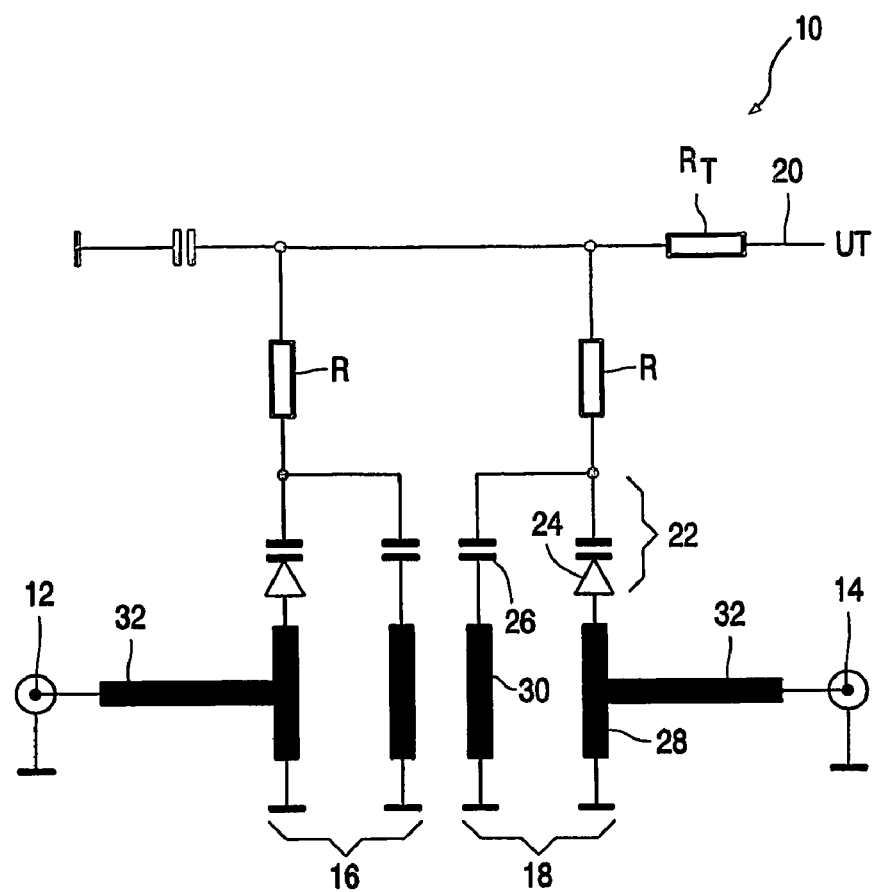
FIG. 1 shows a partially geometric diagram of a first filter circuit.

FIG. 1 shows a diagram of a first filter circuit 10 proposed for this purpose. The diagram is partly geometric, wherein the form and relative arrangement of the microstrips used is shown in principle.

The filter 10 has an input 12 and an output 14. A first resonator 16 is connected to the input 12. A second resonator 18 is connected to the output 14. The resonators 16, 18 are designed to be symmetrical with one another and are coupled electromagnetically to one another. The filter 10 has a connection 20 for a variable voltage VT. Each of the resonators has a capacitor assembly 22 consisting of a capacitance diode 24 and a fixed capacitor 26. The capacitance diode 24 and the capacitor 26 are connected in series. The cathode of the capacitance diode 24 is connected to the variable voltage VT via a high impedance resistor R and a further terminal resistor RT. The resistance of R is at least 5 kΩ, preferably 10-100 kΩ.

Furthermore, each resonator 16, 18 has a first microstrip section 28 and a second microstrip section 30. The capacitor assembly 22 is connected between the first ends of the microstrip sections 28, 30. The second ends are connected to ground. The first and second microstrip sections 28, 30 are arranged next to one another, producing an electromagnetic coupling. However, this coupling is not critical for operation. It is even preferred to arrange the sections 28, 30 a certain distance apart so that the coupling is as low as possible.

The two elements of the capacitor assembly 22, fixed capacitor 26 and capacitance diode 24, are in each case connected to one end of a microstrip section 28, 30. The high impedance resistor R is connected to the respective opposite connection of the elements 24, 26. The anode of the capacitance diode 24 is connected to ground via the first microstrip section 28. This makes it possible to apply, at a suitable variable voltage VT, an appropriate DC voltage in the non-conducting direction of the capacitance diode 24, so that the capacitance can be suitably adjusted within a range. The fixed capacitor 26 acts as an open circuit with respect to the applied DC voltage VT. Said fixed capacitor is necessary to generate the DC voltage via the capacitance diode 24, because the second microstrip section 30 is connected to ground at its second end.

The first resonator 16 and the second resonator 18 are of identical construction and are connected in an identical manner to the variable voltage VT. The response of the two resonators 16, 18 is therefore identical up to resulting tolerances.

Figure 2:
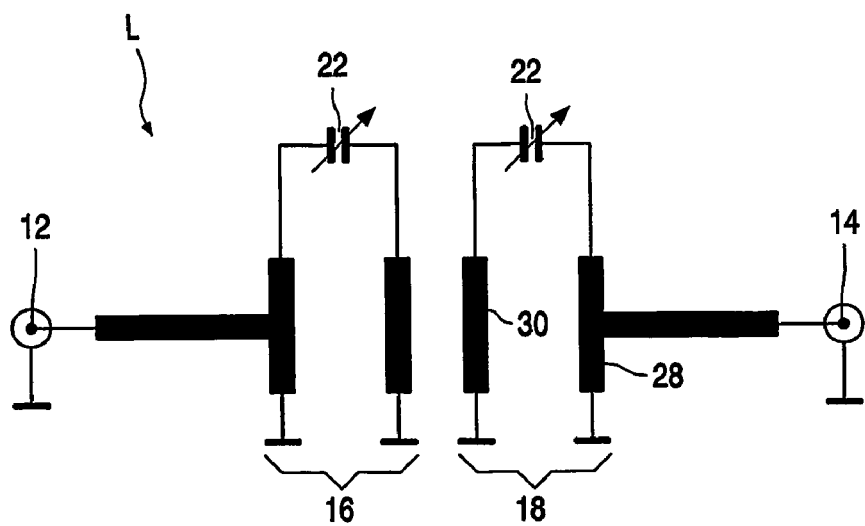
FIG. 2 shows a partially geometric diagram of the frequency-determining elements of the filter circuit of FIG. 1.

FIG. 2 shows a diagram of the filter 10 of FIG. 1, in which the frequency-determining elements are shown. The capacitor assembly 22 is shown as a variable capacitor. In each case the second microstrip sections 30 of the resonators 16, 18 run in parallel next to one another and at a distance apart, so that the resonators 16, 18 are electromagnetically coupled. A bandpass filter characteristic is therefore produced overall between the input 12 and the output 14, wherein the mean frequency can be adjusted by means of the variable capacitors 24.

In this case, the microstrip sections 28, 30 in each case do not act as independent resonators but rather in each case a first and a second microstrip section 28, 30, together with the capacitor assembly 22, form a resonator. Consequently, the filter characteristic is of the second order. The order of the filter therefore corresponds to half the number of microstrip sections. In each resonator 16, 18, the sum of the two microstrip sections acts as inductive element. The resonators 16, 18 therefore act in the same manner as a resonator having a single microstrip, the length of which corresponds essentially to the sum of the lengths of the first microstrip section 28 and the second microstrip section 30. The size of the filter circuit 10 in the longitudinal direction L shown in FIG. 2 is therefore considerably smaller than when using resonators having in each case just one microstrip which is not divided into sections.

In the filter 10, the resonators 16, 18 are coupled to the inputs and outputs 12, 14 by direct connection. In turn, a coupling microstrip 32 which runs at right angles to the microstrip sections 28, 30 is in a symmetrical manner connected to the input and output 12, 14. The coupling microstrip 32 in each case intersects the first microstrip section 28 of the resonators 16, 18. In the example shown, the coupling takes place at the center. This results in a T-shaped structure consisting of the microstrip sections 28 and the coupling microstrip 32. In order to suitably adapt the impedance of input and/or output 12, 14, the point of intersection can also be displaced to one or the other end of the microstrip section 28.

Figure 3:
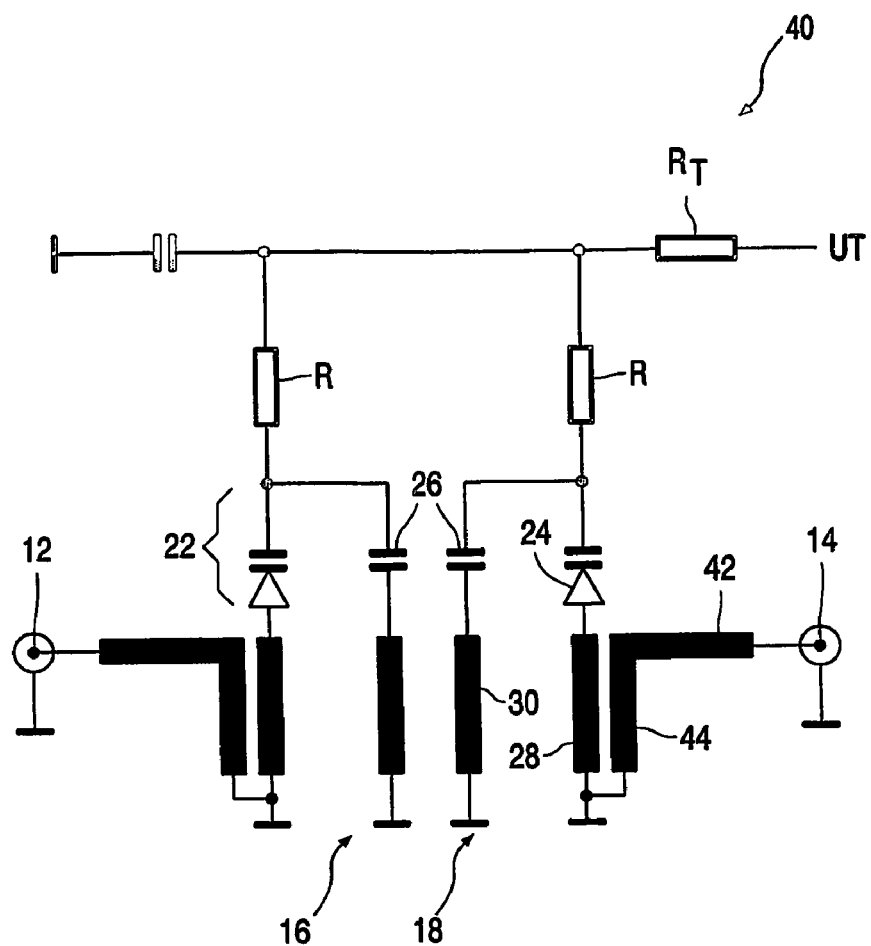
FIG. 3 shows a partially geometric diagram of a second filter circuit.

FIG. 3 shows a second filter circuit 40. The filter circuit largely corresponds in terms of its structure to the filter circuit 10 of FIG. 1. Identical elements bear the same references. Hereinbelow, only the differences with respect to the circuit 10 of FIG. 1 will be discussed.

By contrast with the circuit 10, in the circuit 40 the inputs and outputs 12, 14 are electromagnetically coupled. The coupling in this case comprises a first coupling microstrip 42 which is connected to the input and output 12, 14 and runs at right angles to the microstrip sections 28, 30. The first coupling microstrip 42 forms an L-shaped structure with a second coupling microstrip 44 that runs at a slight distance parallel to the first microstrip section 28 of the resonators 16, 18. The end of the second coupling microstrip 44 is connected to ground.

The second coupling microstrip is in close electromagnetic coupling with the first microstrip section 28, so that the signal from the input 12 is coupled into the first resonator 16 and coupled out of the second resonator 18 to the output 14.

Figure 4:
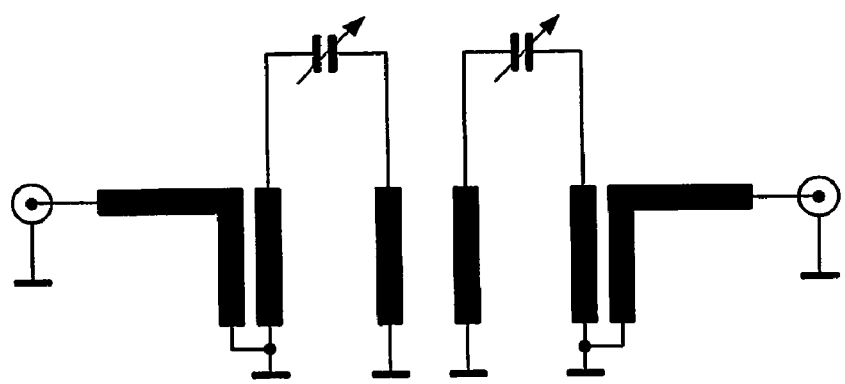
FIG. 4 shows a partially geometric diagram of the frequency-determining elements of the filter circuit of FIG. 3.

FIG. 4 in turn shows the frequency-determining elements of the filter circuit 40.

Figure 5:
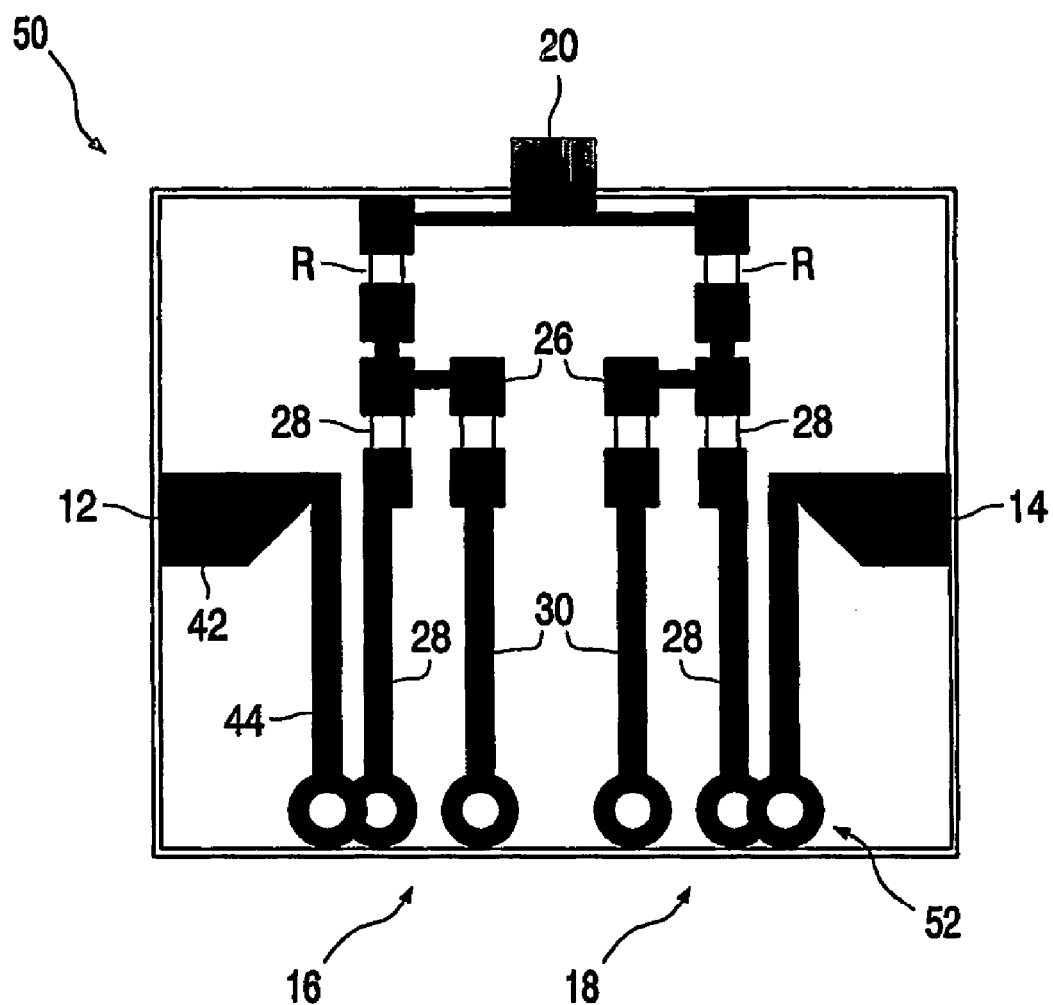
FIG. 5 shows a diagram of the front side of a filter.

FIG. 5 shows a filter 50 constructed in accordance with the circuit 40. The dark regions are copper structures on an insulating substrate. On the rear side of the insulating substrate there is a conductive layer that is connected to ground. The filter 50 has an input 12 and an output 14 and also a connection for the variable voltage VT. The high impedance resistors R, like the fixed capacitors 26 and the capacitance diodes 28, are discrete components which are soldered onto the surface of the substrate. The use of discrete components is advantageous at the capacitances of a few pF that are preferably used. As an alternative, the components, in particular capacitors having a low capacitance, may also be applied to the substrate as printed components. The coupling microstrips 42, 44 and the first and second microstrip sections 30, 28 of the resonators 16, 18 are formed by the arrangement as shown in FIG. 3. The connection to ground is formed by means of through-connections 52 to the rear side of the substrate.

The filter 50 has a width of 12 mm and a length of only 10 mm. However, the effective length of the microstrips of each substrate corresponds to the sum of the individual microstrip sections 28, 30 and is therefore more than the 10 mm length of the filter 50 in this direction.

Figure 6:
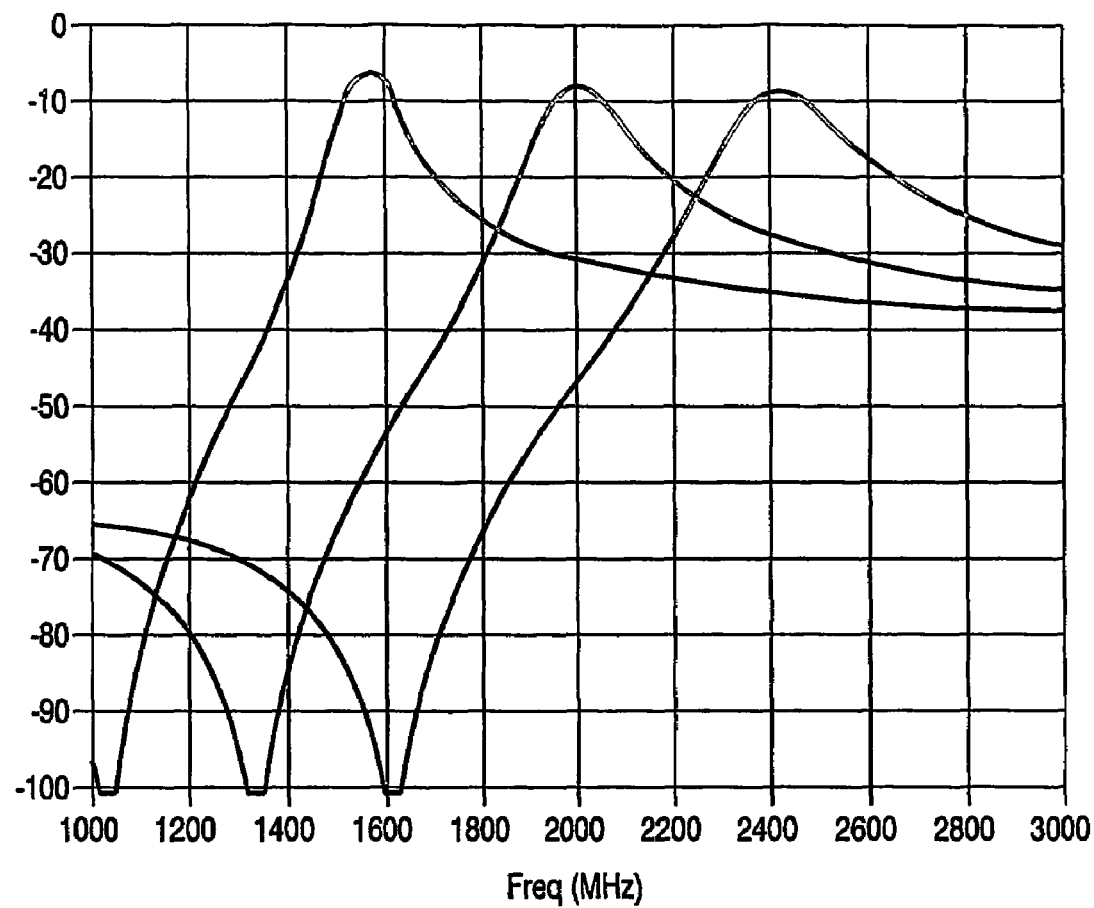
FIG. 6 shows a diagram of the filter characteristic at different mean frequencies.

FIG. 6 shows the filter characteristic of the filter 6 at different mean frequencies. The attenuation in dBc is shown against the frequency in MHz. The characteristic for three different values of the variable voltage VT, that is to say three different capacitances, is shown.

In the abovementioned examples of embodiment of filter circuits, in each case two resonators are provided, producing a filter response of the second order. It is possible for further resonators to be provided between the first and second resonators, the microstrip sections of which further resonators run parallel to the microstrip sections 28, 30 of the first and second resonators 16, 18 and are electromagnetically coupled to the latter.

Further possible modifications to the filter relate to the coupling of input 12 and output 14. In this case, various types of coupling known to the person skilled in the art may be selected. In particular, asymmetric coupling may be selected.

The invention claimed is:

1. A filter circuit comprising
an input and an output and
first and second resonators, one of which is coupled to the input and the other of which is coupled to the output,
wherein each resonator has, as frequency determining elements, a first straight microstrip section, a second straight microstrip section and a capacitor assembly,
wherein, in each resonator, the capacitor assembly is connected between first ends of the microstrip sections, and second ends of the microstrip sections are connected to ground,
and wherein the first and second microstrip sections in each resonator are arranged in parallel next to one another,
and wherein one of the microstrip sections of the first resonators is electromagnetically coupled to at least one of the microstrip sections of the second resonator by the microstrip sections of the resonators being arranged in parallel next to one another and at a distance apart.

2. A filter as claimed in claim 1, in which the capacitor assembly of each resonator comprises at least one variable capacitor.

3. A filter as claimed in claim 2, in which the capacitor assembly of each resonator comprises a series circuit of a fixed capacitor and the at least one variable capacitor.

4. A filter as claimed in claim 1, in which the capacitor assembly of each resonator comprises a capacitance diode which is connected to a variable voltage via a high impedance resistor.

5. A filter as claimed in claim 1, in which the first and second microstrip sections in each resonator have the same length.

6. A filter as claimed in claim 1, in which one of the microstrip sections of the first resonators coupled exclusively electromagnetically to one of the microstrip sections of the second resonator.

7. A filter as claimed in claim 1, in which between the input and the output there is a filter response of an order that corresponds to half the number of microstrip sections of the resonators.

8. A filter as claimed in claim 1, in which the microstrip sections are attached to a front side of an insulating substrate, in which a conductive layer on the rear side is connected to ground, wherein the first and second microstrip sections each have at their second end a through-connection to the rear side of the substrate.

9. A filter as claimed in claim 1, in which the input is coupled to the first resonator,
wherein the input is connected to a coupling microstrip which runs at right angles to the microstrip sections of the resonators,
and wherein the coupling microstrip intersects the first microstrip section of the first resonator.

10. A filter as claimed in claim 1, in which the input is coupled to the first resonator,
wherein the input is connected to a first coupling microstrip which runs at right angles to the microstrip sections of the first resonator,
and wherein the first coupling microstrip is connected to a second coupling microstrip which runs in parallel next to and is electromagnetically coupled to the first microstrip section of the first resonator.

* * * * *